(12) United States Patent
Rouse et al.

(10) Patent No.: US 6,503,801 B1
(45) Date of Patent: Jan. 7, 2003

(54) NON-UNIFORM CHANNEL PROFILE VIA ENHANCED DIFFUSION

(75) Inventors: Richard P. Rouse, San Francisco, CA (US); Che-Hoo Ng, San Martin, CA (US); Judy X. An, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 48 days.

(21) Appl. No.: 09/640,186

(22) Filed: Aug. 17, 2000

Related U.S. Application Data
(60) Provisional application No. 60/149,440, filed on Aug. 18, 1999.

(51) Int. Cl.$^7$ .............................................. H01L 21/336
(52) U.S. Cl. ....................... 438/289; 438/308; 438/528; 438/530
(58) Field of Search ................................. 438/217, 286, 438/289, 290, 291, 308, 407, 528, 530, 545, 546

(56) References Cited

U.S. PATENT DOCUMENTS

| | | | | |
|---|---|---|---|---|
| 5,792,699 | A | | 8/1998 | Tsui ............................ 438/290 |
| 5,899,732 | A | * | 5/1999 | Gardner et al. ............. 438/528 |
| 6,066,535 | A | * | 5/2000 | Murai ......................... 438/305 |
| 6,136,673 | A | * | 10/2000 | Frei et al. .................... 438/528 |

FOREIGN PATENT DOCUMENTS

JP       5-190848    * 7/1993

* cited by examiner

*Primary Examiner*—Chandra Chaudhari

(57) ABSTRACT

A semiconductor device with reduced leakage current is obtained by forming a non-uniform channel doping profile. A high impurity region of the opposite conductive type of a source region is formed between the channel region and source region by transient enhanced diffusion (TED). The high impurity region substantially reduces the threshold voltage rolling off problem.

14 Claims, 4 Drawing Sheets

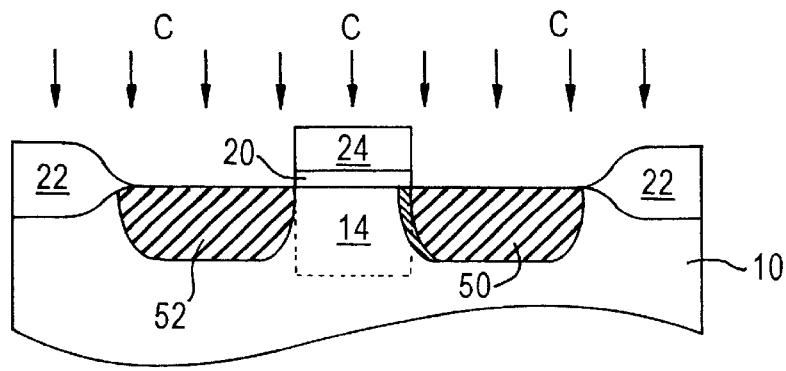
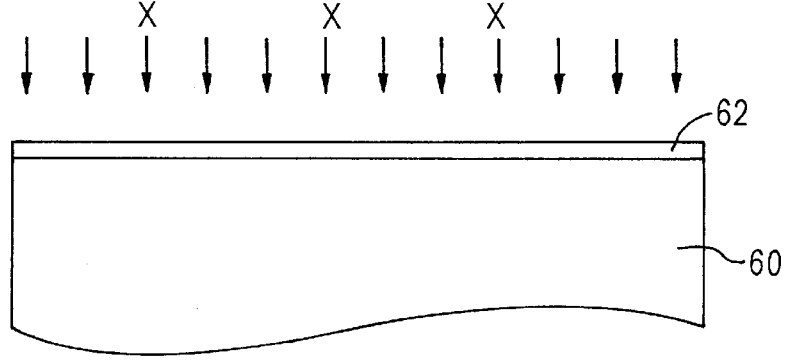
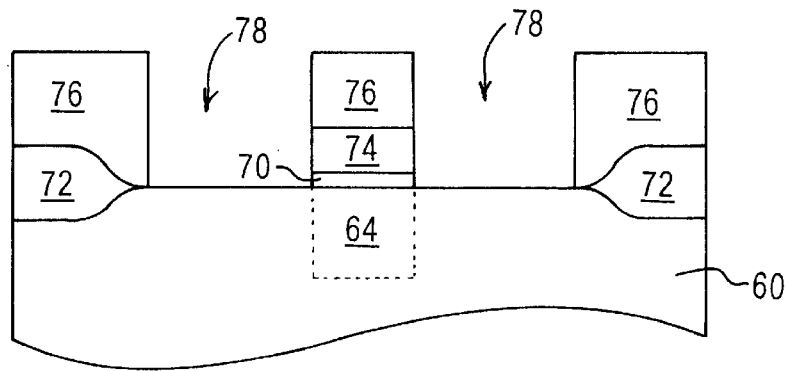
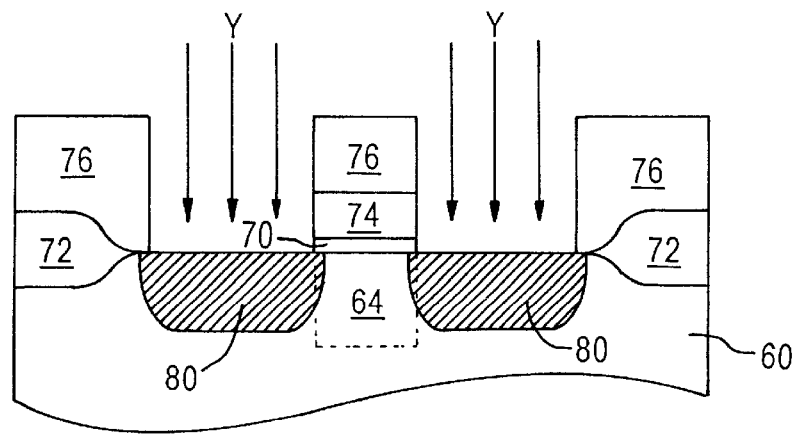

NON-UNIFORM CHANNEL PROFILE VIA ENHANCED DIFFUSION

RELATED APPLICATIONS

This application claims priority from Provisional Application Serial No. 60/149,440 filed on Aug. 18, 1999 entitled: "NON-UNIFORM CHANNEL PROFILE VIA ENHANCED DIFFUSION", the entire disclosure of which is hereby incorporated by reference herein.

FIELD OF THE INVENTION

The present invention relates generally to a semiconductor device with transistors, and to a method of manufacturing the semiconductor device. The present invention has particular applicability in semiconductor devices comprising high density metal oxide semiconductor field effect transistors (MOSFETs) with submicron dimensions.

BACKGROUND OF THE INVENTION

Over the last few decades, the electronics industry has undergone a revolution by various efforts to decrease the size of device element formed in integrated circuits (IC), and such the efforts have contributed in increasing the density of circuit elements and device performance. A large variety of semiconductor devices have been manufactured having various applications in numerous disciplines. Currently, the most common and important semiconductor technology presently used is silicon-based, and the most preferred silicon based semiconductor device is a metal-oxide-semiconductor (MOS) transistor.

The principal elements of a typical MOS semiconductor generally comprise a semiconductor substrate on which a gate electrode is disposed. The gate electrode is typically a heavily doped conductor having uniform conductivity. An input signal is typically applied to the gate electrode via a gate terminal. Heavily doped active regions, e.g., source/drain regions, are formed in the semiconductor substrate and are connected to source/drain terminals. The typical MOS transistor is symmetrical, which means that the source and drain are interchangeable. Whether an active region acts as a source or drain depends on the respective applied voltages and the type of device being made, e.g., PMOS or NMOS. A channel region is formed in the semiconductor substrate beneath the gate electrode and separates the source/drain regions. The channel region is typically lightly doped with an impurity type opposite to that of the source/drain regions, and the impurity concentration profile is substantially uniform from the surface into the substrate, as shown by line A in FIG. 2. The gate electrodes is generally separated from the semiconductor substrate by an insulating layer, e.g., an oxide layer, to prevent current from flowing between the gate electrode and the source/drain regions or channel regions.

In practical MOSFET device, a channel implantation process is frequently performed to augment the substrate doping of the same conductivity. Thus, for an NMOS device, a p-type impurity is ion implanted into the substrate and channel region, and for a PMOS device, an n-type impurity is ion implanted into the substrate and channel region. The threshold voltage is the minimum required voltage applied to the gate electrode of a MOSFET device so as to invert the conductivity of the surface of the semiconductor substrate, forming a conduction channel that is of the same conductivity type as the source and drain regions. As shown by curve A in FIG. 13, as the device size shrinks, the channel length decreases and, after some point, the threshold voltage starts to decrease appreciably with the channel length. The decrease of the threshold voltage with the channel length is theoretically predicted, and this phenomenon is known as the "short channel effect (SCE)".

Contrary to what is normally expected, in modem technologies, it has been observed that a threshold voltage initially increases with decreasing channel length, before the threshold voltage eventually decreases rather sharply, as shown by curve B in FIG. 13. This phenomenon has been termed "reverse short channel effect (RSCE)" or "threshold voltage roll-off". Rafferty et al. (IEDM Tech. Dig., pp. 311, 1993) proposed that RSCE is a result of the transient enhanced diffusion of the channel profile induced by source/drain implantation. They explained that the damage by source/drain implantation generates silicon self-interstitials which flow outward and then recombine (annihilated) at the silicon surface under the gate oxide, thereby giving rise to a flux of the channel implant impurity toward the surface and raising the surface concentration of the channel impurity, leading to RSCE. It has been experimentally discovered that RSCE can be avoided by preventing the channel implant from increasing at the surface of a silicon substrate.

Many approaches have been introduce, such as a retrograde channel profile, to control or even eliminate RSCE. The retrograde channel profile has an impurity concentration peak deep under the surface. Conventionally a retrograde channel profile is formed by controlling the ion implantation energy such that an impurity concentration peak is formed at a certain depth below the surface of a semiconductor substrate. However, it is difficult to achieve an optimum retrograde channel profile to reduce RSCE because the implanted impurity atoms easily diffuse toward the substrate surface by the subsequent processing steps, e.g., annealing, thereby resulting in less steep retrograde boron profile in the channel region.

Thus, there is a continuing need for improved method to reduce RSCE and the threshold voltage rolling off.

DISCLOSURE OF THE INVENTION

An advantage of the present invention is simplified, efficient and production worthy methodology for manufacturing a MOSFET device exhibiting less susceptibility to the reverse short channel effects.

Additional advantages and other features of the present invention will be set forth in part in the description which follows and in part will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantage are achieved in part by a method of manufacturing a semiconductor device, the method comprising: ion implanting atoms into a portion of a main surface of a semiconductor substrate or a well region containing a first conductive type impurity, to form a damage region adjacent to a first side portion of a channel region in the main surface; annealing to diffuse the first conductive type impurity atoms in the channel region and damage region toward an interface region between the channel region and damage region, thereby forming a high impurity region of the first conductive type in the interface region; and ion implanting a second conductive type impurity into the main surface to form a source region overlapping the damage region and adjacent to the first side portion of the channel region.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF DRAWINGS

FIGS. 1 to 5 illustrate sequential phases of a method according to an embodiment of the resent invention.

FIGS. 6 to 10 illustrate sequential phases of a method according to another embodiment of the present invention.

In FIGS. 1 to 10, similar features are denoted by similar reference numerals.

DESCRIPTION OF INVENTION

The present invention enables the manufacture of a semiconductor device exhibiting less susceptibility to the reverse short channel effects and threshold voltage rolling-off by forming a high impurity region of the opposite conductive type to the source region at the junction between the channel region and source region. The high impurity region is formed by diffusing impurity atoms contained in the substrate toward an interface region between of the channel region and source region. Embodiments of the present invention include forming a damage region adjacent to the channel region, and annealing the substrate to effect diffusion of the impurity atoms and to repair the lattice damage in the damage region. Accordingly, the present invention provides simplified, efficient and production worthy methodology for forming a non-uniform channel impurity profile without excessive ion implanting and masking steps.

Figure 1:
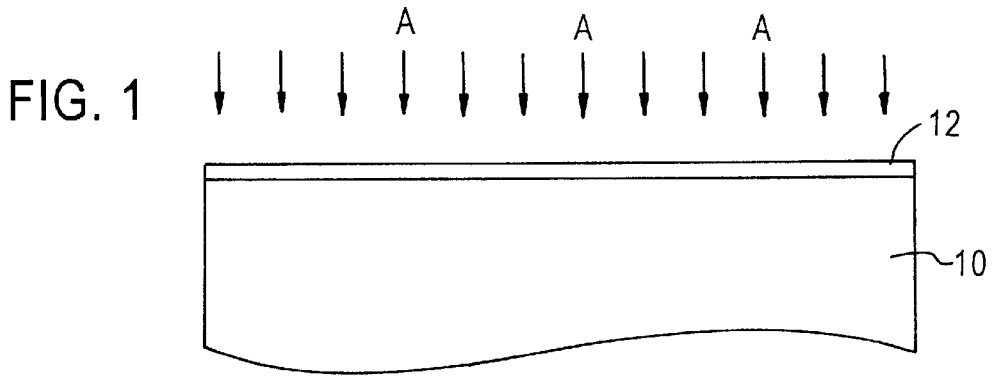
Figure 2:
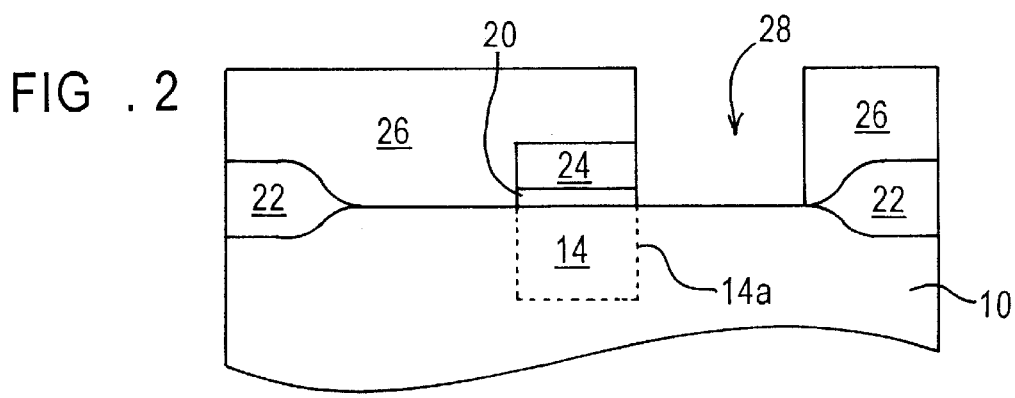

In accordance with an embodiment of the present invention, as shown in FIG. 1, a surface portion of semiconductor substrate 10 is ion implanted, as shown by arrows A, with the first conductive type impurity, e.g., a p type impurity for an NMOS device, for the purpose of forming either a well region or channel doping region for threshold voltage adjustment. A dielectric layer 12, e.g., an oxide layer, can be formed on the surface either before or after the ion implantation. A conductive layer, e.g., a polycrystalline silicon layer, is formed on the dielectric layer 12. The dielectric layer 12 and conductive layer are either simultaneously or independently patterned by conventional photolithographic and etching techniques to form gate oxide 20 and gate electrode 24, as shown in FIG. 2. Field oxide layers 22 can be also formed by conventional oxidation techniques. Subsequently, a mask layer 26, e.g., a photoresist layer, is formed on the surface of the substrate 10, covering the gate oxide 20 and gate electrode 24, and then patterned by conventional photolithographic and etching techniques to form a mask defining opening 28 exposing the surface portion of the substrate adjacent to a side portion 14A of a channel region 14, as shown in FIG. 2.

Figure 3:
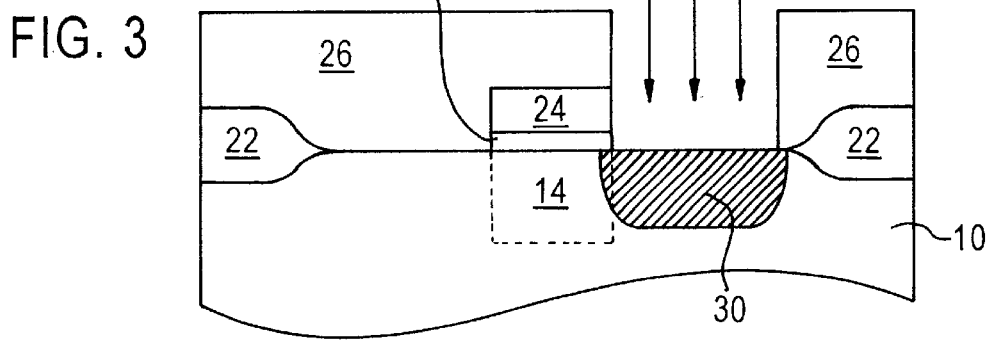
Figure 4:
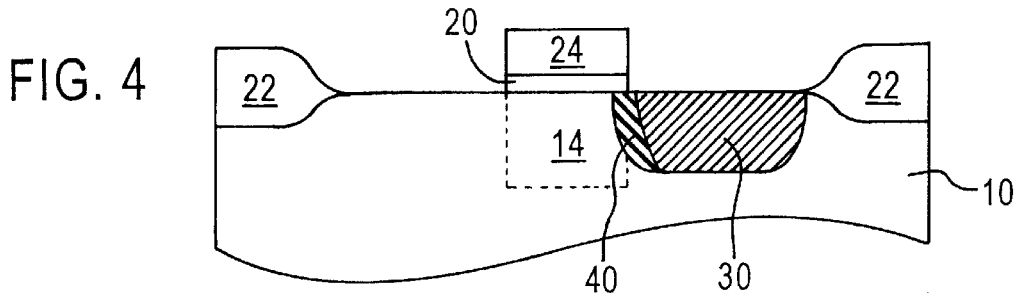

As shown in FIG. 3, germanium, silicon, boron, indium, or arsenic atoms are ion implanted as shown by arrows B, through the opening 28 to form a damage region 30 in the substrate 10 adjacent to the channel region 14. During ion implantation, the implanted atoms displace the atoms in the damage region 30, thereby damaging the crystal lattice structure of the damage region 30. Such damage is typically in the formed of vacancies, i.e., holes or vacant lattice sites, and interstitials, i.e., atoms occupying interstices between normal lattice sites. These vacancies and interstitials are also referred to as point defects. In an embodiment of the present invention, germanium atoms are ion implanted to form damage region 30, as at an implantation dosage of about $1 \times 10^{14}$ atoms cm$^{-2}$ to about $3 \times 10^{15}$ atoms cm$^{-2}$ and at an implantation energy level of about 5 KeV to about 100 KeV. In another embodiment of the present invention, silicon atoms can be ion implanted to form damage region 30, as at an implantation dosage of about $1 \times 10^{14}$ atoms cm$^{-2}$ to about $3 \times 10^{15}$ atoms cm$^{-2}$ and at an implantation energy level of about 5 KeV to about 150 KeV.

Figure 11:
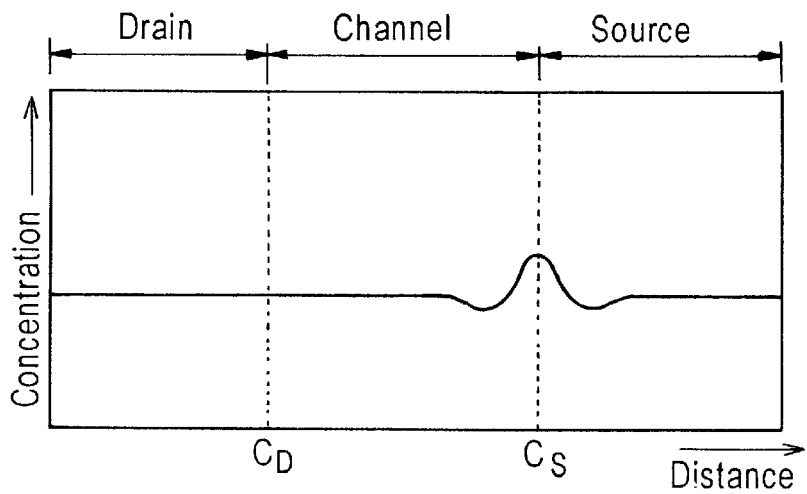
FIGS. 11 to 12 illustrate channel doping profiles in accordance with embodiments of the present invention.

Subsequently, substrate 10 including damage region 30, is annealed to diffuse the first conductive type impurity atoms in the damage region 30 and channel region 14 toward the interface region between the channel region 14 and damage region 30, thereby forming a high impurity region 40 of the first conductive type therebetween. While the excess vacancies and interstitials in the damage region 30 recombine with each other at the early stage of the annealing step, the effective diffusion rate of the first conductive type impurity atoms in the vicinity of the interface between damage region 30 and the channel region 14 increases dramatically. This phenomenon is known as transient enhanced diffusion (TED). As a result, diffused impurity atoms are piled up at the interface between damage region 30 and channel region 14. The first conductive type impurity profile of the channel region 14 and damage region 30 is shown in FIG. 11. As shown in FIG. 11, upon annealing, impurity atoms are diffused toward the interface $C_S$ from both cannel region 14 and damage region 30, and piled up at the interface $C_S$, thereby achieving a non-uniform channel profile with a high impurity region 40 at the interface $C_S$. For example, the substrate is annealed at a temperature of about 800° C. to about 900° C. for about 15 minutes to about 20 minutes.

After forming high impurity region 40, a second conductive type impurity is ion implanted, e.g., an n type impurity for an NMOS device, as shown by arrows C, into the substrate bordering both sides of the channel region 14 to form source and drain region 50, 52. The source region 50 is formed in the substrate 10 overlapping the damage region 30. The high impurity region 40 is located between the channel region 14 and source region 50 as shown in FIG. 5. The asymmetrical channel profile with high impurity region 40 at the interface $C_S$ substantially prevents the silicon self-interstitials which are generated by the source/drain implantation damage from flowing outwardly and recombined at the surface under the gate oxide, thereby reducing the surface concentration of the channel impurity. Thus, the non-uniform channel profile at the junction region substantially improves the threshold voltage rolling-off problem.

Figure 9:
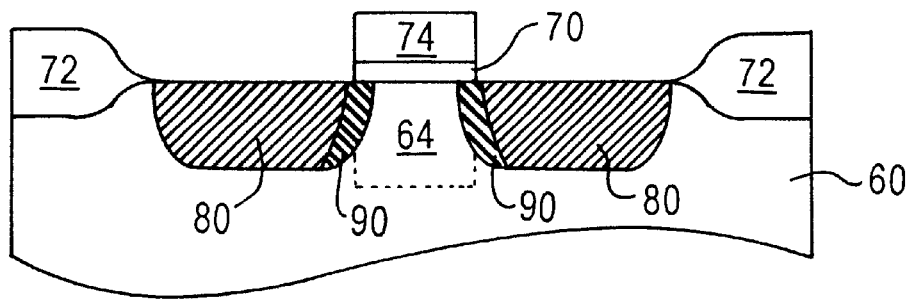

In accordance with another embodiment of the present invention, high impurity regions are formed at both sides of the channel region. As shown in FIG. 6, a surface portion of the semiconductor substrate 60 is ion implanted, as shown by arrows X, with first conductive type impurity atoms. A dielectric layer 62 is formed on the surface, and a conductive layer is formed on dielectric layer 62. Dielectric layer 62 and conductive layer are then patterned by conventional photolithographic and etching techniques to form a gate oxide 70 and gate electrode 74 thereon. A mask layer 76 is then formed on the substrate 60 and patterned to form a mask defining openings 78 exposing the surface portions of the substrate 60 adjacent to both side portions of channel region 64, as shown in FIG. 7. Damage regions 80 are then formed in substrate 60 adjacent to the channel region 64, by ion implanting germanium, silicon, boron, indium, or arsenic atoms, as shown by arrows Y, through the openings 78. Subsequently, substrate 60 is annealed to form high impurity regions 90 at the junctions between the channel region 64 and damage regions 80, as shown in FIG. 9.

Figure 10:
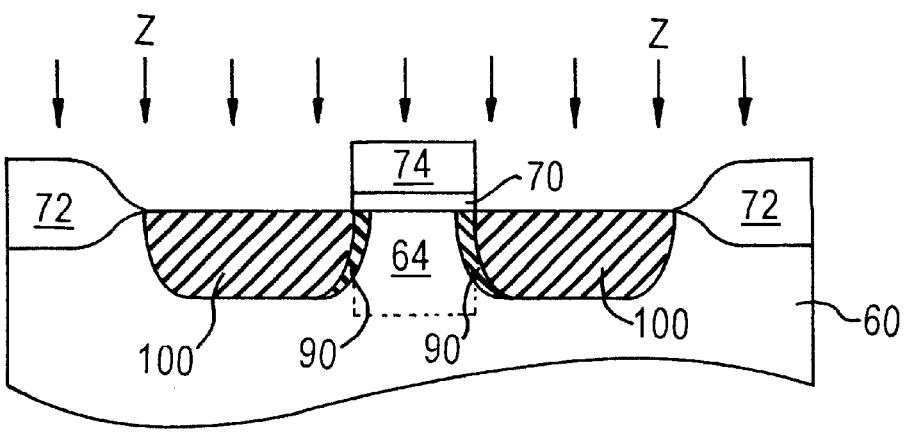
Figure 12:
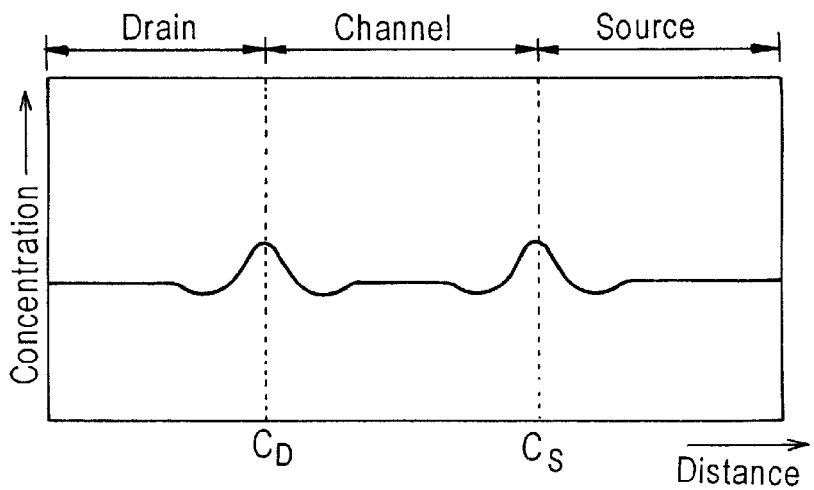
Figure 13:
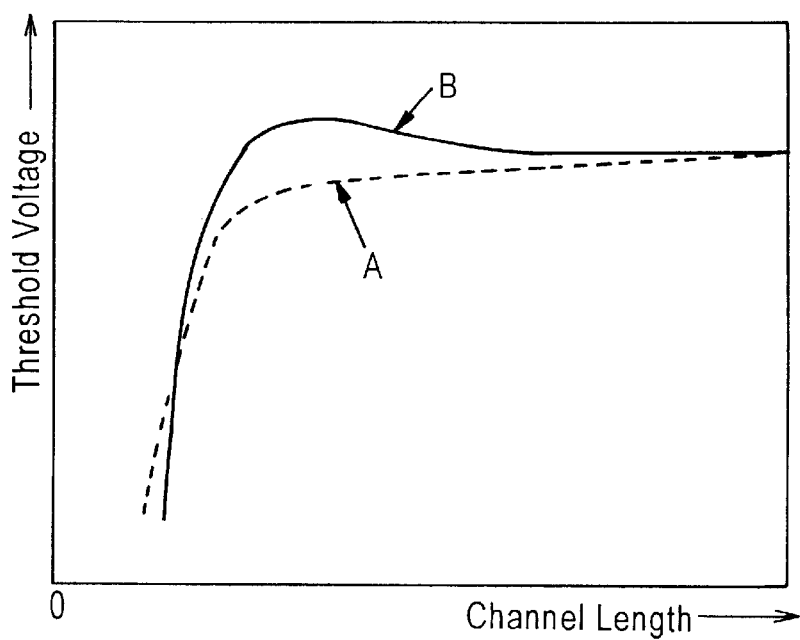
FIG. 13 plots behavior of a threshold voltage as a function of the channel length of a MOSFET device.

As shown in FIG. 12, upon annealing, the impurity atoms in the surface portion of the substrate 60 are diffused toward junction regions $C_D$ and $C_S$ between channel region 64 and damage regions 80 and piled up the junction regions $C_D$ and $C_S$, thereby achieving a non-uniform channel profile with high impurity regions 90 at the junction regions $C_D$ and $C_S$. After forming high impurity regions 90, second conductive type impurity atoms are ion implanted, as shown by arrows Z, through the openings 78 to form source and drain regions 100. Source and drain regions 100 are formed overlapping damage regions 80, with high impurity regions 90 located between the channel region 64 and source and drain region 100, as shown in FIG. 10. The non-uniform channel profile with high impurity region 40 at the junction regions $C_D$ and $C_S$ substantially improves the threshold voltage rolling-off problem.

Embodiments of the present invention involve the use of conventional materials and methodology to form various components of a transistor and semiconductor device. For example, the semiconductor substrate employed in the embodiments of the present invention typically comprises monocrystalline silicon.

The present invention enjoys industrial applicability in various type of semiconductor device, particularly in semiconductor devices designed for high speed performance. Therefore, the present invention is applicable to any CMOS technology.

In the previous description, numerous specific details are set forth such as specific material, structure, chemicals, process, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and a few examples of its versatility are shown and described in the present disclosure. It is to be understood that the present invention is capable of use in various other combinations and environments and is capable of changes or modifications within the scope of the inventive concept as expresses herein.

What is claimed is:

1. A method for manufacturing a semiconductor device, the method comprising:
   ion implanting atoms into a portion of a main surface of a semiconductor substrate or a well region containing a first conductive type impurity, to form a damage region adjacent to a first side portion of a channel region in the main surface;
   annealing to diffuse the first conductive type impurity atoms in the channel region and damage region toward an interface region between the channel region and damage region, thereby forming a high impurity region of the first conductive type in the interface region; and
   ion implanting a second conductive type impurity into the main surface to form a source region overlapping the damage region and adjacent to the first side portion of the channel region;
   wherein the channel region, damage region and source region form a non-uniform channel impurity profile that reduces a threshold voltage roll-off associated with the channel region.

2. The method according to claim 1, comprising ion implanting germanium, silicon, boron, indium, or arsenic atoms to form the damage region.

3. The method according to claim 2, comprising ion implanting germanium into the substrate at an impurity dosage of about $1 \times 10^{14}$ to about $3 \times 10^{15}$ atoms cm$^{-2}$ and at an implantation energy of about 5 KeV to about 100 KeV to form the damage region.

4. The method according to claim 2, comprising ion implanting silicon into the substrate at an impurity dosage of about $1 \times 10^{14}$ to about $3 \times 10^{15}$ atoms cm$^{-2}$ and at an implantation energy of about 5 KeV to about 150 KeV to form the damage region.

5. The method according to claim 2, comprising annealing the at a temperature of about 800° C. to about 900° C. for about 15 minutes to about 20 minutes to form the high impurity region.

6. The method according to claim 2, further comprising:
   forming a gate electrode on the main surface overlying the channel region with a gate dielectric layer therebetween;
   forming a first mask region on the main surface to expose the first portion of the main surface adjacent to the first side portion of the channel region; and
   ion implanting atoms to form the damage region adjacent to the first side portion of the channel region.

7. The method according to claim 6, further comprising:
   forming a second mask region on the main surface, leaving exposed portions of the main surface adjacent to both sides of the channel region; and
   ion implanting the second conductive type impurity atoms to form source/drain regions adjacent to the channel region in the main surface, wherein the source region overlaps the damage region.

8. A method of manufacturing a semiconductor device, the method comprising:
   ion implanting atoms into portions of a main surface of a semiconductor substrate or a well region containing a first conductive type impurity to form damage regions adjacent to both side portions of a channel region in the main surface;
   annealing to diffuse the first conductive type impurity atoms in the channel region and damage regions toward interface regions between the channel region and damage regions, forming high impurity regions of the first conductive type in the interface regions; and
   ion implanting the second type impurity atoms into the main surface to form source/drain regions adjacent to the side portions of the channel region;
   wherein the channel region, damage regions and source/drain regions form a non-uniform channel impurity profile that reduces a threshold voltage roll-off associated with the channel region.

9. The method according to claim 8, comprising ion implanting germanium, silicon, boron, indium or arsenic atoms to form the damage regions.

10. The method according to claim 9, comprising ion implanting germanium into the substrate at an impurity dosage of about $1\times10^{14}$ to about $3\times10^{15}$ atoms $cm^{-2}$ and at an implantation energy of about 5 KeV to about 100 KeV to form the damage regions.

11. The method according to claim 9, comprising ion implanting silicon into the substrate at an impurity dosage of about $1\times10^{14}$ to about $3\times10^{15}$ atoms $cm^{-2}$ and at an implantation energy of about 5 KeV to about 150 KeV to form the damage regions.

12. The method according to claim 9, comprising annealing the substrate at a temperature of about 800° C. to about 900° C. for about 15 minutes to about 20 minutes to form the high impurity regions.

13. The method according to claim 9, further comprising:

forming a gate electrode on the main surface overlying the channel region with a gate dielectric layer therebetween;

forming a mask region on the main surface and on the gate electrode, leaving exposed portions of the main surface adjacent to the side portions of the channel region; and ion implanting atoms to form the damage regions adjacent to the side portions of the channel region.

14. The method according to claim 13, further comprising ion implanting the second conductive type impurity to form source/drain regions in portions of the main surface adjacent to the side portions of the channel region.

* * * * *

UNITED STATES PATENT AND TRADEMARK OFFICE
CERTIFICATE OF CORRECTION

PATENT NO. : 6,503,801 B1
DATED : January 7, 2003
INVENTOR(S) : Richard P. Rouse et al.

It is certified that error appears in the above-identified patent and that said Letters Patent is hereby corrected as shown below:

<u>Title page,</u>
Item [*] Notice, should read -- Subject to any disclaimer, the term of this patent is extended or adjusted under 35 U.S.C. 154(b) by 0 days. --.

Signed and Sealed this

Thirtieth Day of August, 2005

JON W. DUDAS
*Director of the United States Patent and Trademark Office*